United States Patent [19]

Yamaji et al.

[11] Patent Number: 5,262,922
[45] Date of Patent: Nov. 16, 1993

[54] HEAT RADIATION STRUCTURE FOR SEMICONDUCTOR DEVICE

[75] Inventors: Hiroshi Yamaji, Kawasaki; Takashi Kanno, Yokohama; Takashi Sato, Kawasaki; Riichi Magome; Tomoyuki Hongho, both of Yokohama, Japan

[73] Assignee: Fujitsu, Limited, Kawasaki, Japan

[21] Appl. No.: 842,331

[22] PCT Filed: Jul. 26, 1991

[86] PCT No.: PCT/JP91/01006
§ 371 Date: Mar. 26, 1992
§ 102(e) Date: Mar. 26, 1992

[87] PCT Pub. No.: WO92/02117
PCT Pub. Date: Feb. 6, 1992

[30] Foreign Application Priority Data

Jul. 26, 1990 [JP] Japan ................... 2-80211[U]

[51] Int. Cl.⁵ ............................................. H05K 7/20
[52] U.S. Cl. ................................. 361/720; 165/80.3; 165/185; 174/16.3; 361/690; 361/707; 257/712
[58] Field of Search ................... 165/80.3, 185; 174/16.3; 357/81; 361/381, 383, 386–389, 410

[56] References Cited

U.S. PATENT DOCUMENTS 3,958,155  5/1976  Bagholtz et al. ............... 361/410
4,150,440  4/1979  Bonnie et al. .................. 361/389

FOREIGN PATENT DOCUMENTS

62-196391  12/1987  Japan .
63-16492    2/1988  Japan .
1-135736    9/1989  Japan .

Primary Examiner—Gregory D. Thompson
Attorney, Agent, or Firm—Staas & Halsey

[57] ABSTRACT

A heat radiation structure is provided for a semiconductor device, by which a mounting height of the semiconductor device can be lowered to increase an accommodation density in a shelf, and the mounting/dismounting is easily carried out. In a heat-radiation structure for a semiconductor device, in which a semiconductor device (2) is mounted on a printed circuit board (1) so that the bottom surface thereof confronts an opening (1a) formed in the printed circuit board, a heat-conductive member (3, 11) is brought into tight contact with the bottom surface of the semiconductor device and the opposite end surface of thereof is protruded through the opening (1a) from the back side of the printed circuit board while in tight contact with a heat-radiation plate (4) disposed at that position, so that heat generated from the semiconductor device is transmitted to the heat-radiation plate (4) via the heat-conductive member (3, 11) and radiated from the outer surface thereof into air. At least one of the semiconductor device (2) and the heat-radiation plate (4) is made of a magnetic substance so that the two members are brought into tight contact with the heat-conductive member by the attraction force of a permanent magnet (3, 10) disposed between the two members.

13 Claims, 5 Drawing Sheets

HEAT RADIATION STRUCTURE FOR SEMICONDUCTOR DEVICE

FIELD OF THE INVENTION

The present invention relates to a heat radiation structure for a semiconductor device to be surface-mounted on a printed circuit board.

DESCRIPTION OF THE RELATED ART

Figure 8:
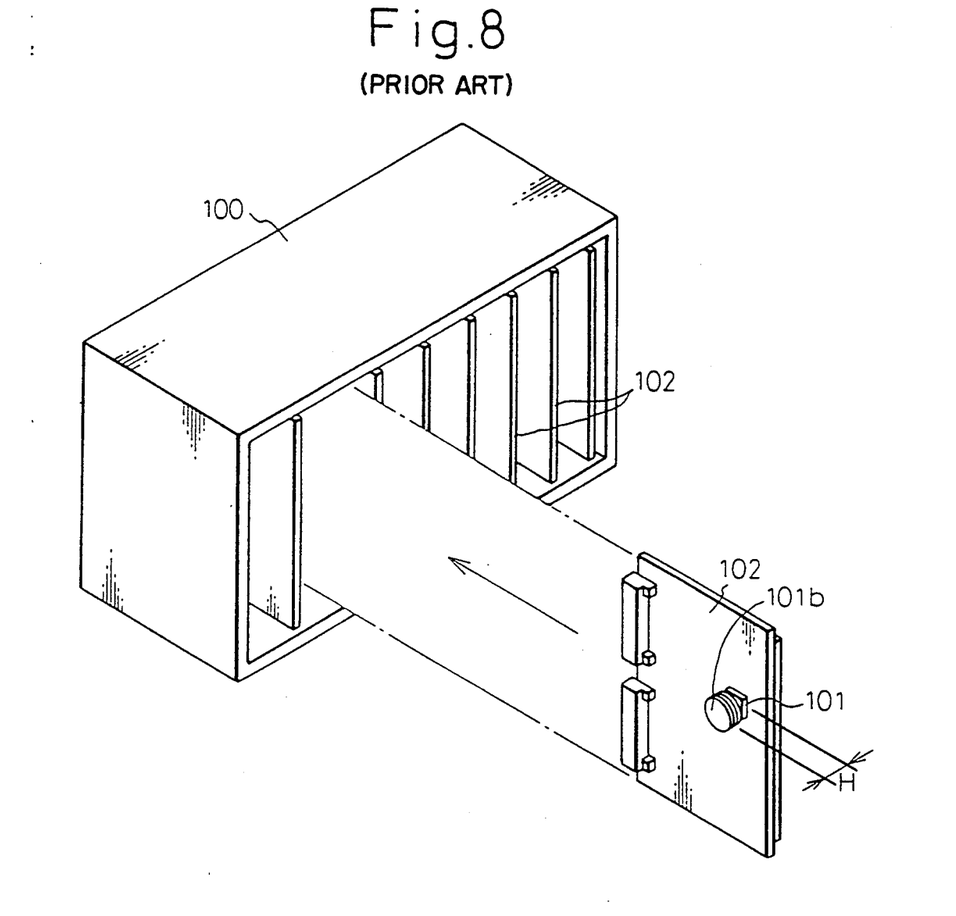
FIG. 8 is a perspective view of an electronics apparatus of the product comprising a semiconductor device with a heat-radiation fin.

As shown in FIG. 8, an electronics apparatus, such as a telecommunication apparatus, comprises a box-like shelf 100 in which a plurality of printed circuit boards 102, each provided with semiconductor devices 101, such as LSI or others, are accommodated in parallel to each other. In line with recent developments in the surface-mounting technology, electronics parts have been miniaturized and can be installed on the printed circuit board at a high density, while keeping the height thereof at a low level. Nevertheless, there is a need for the provision of a heat-radiation fin 101b, for effectively cooling the semiconductor device, because the heat generated by the semiconductor device 101 increases as the degree of integration thereof increases, but this makes the mounting height H of the semiconductor device 101 larger. Accordingly, the pitch of (i.e., the space between) the adjacent printed circuit boards 102 in the shelf must be made larger, to receive this height, and this contradicts the primary object of reducing the total size of the electronics apparatus by the miniaturization of the electronics parts.

Further, when the semiconductor device is installed on the printed circuit board by an automatic mounting machine, the height of the heat-radiation fin inhibits the effective operation of the automatic mounting machine.

Figure 9:
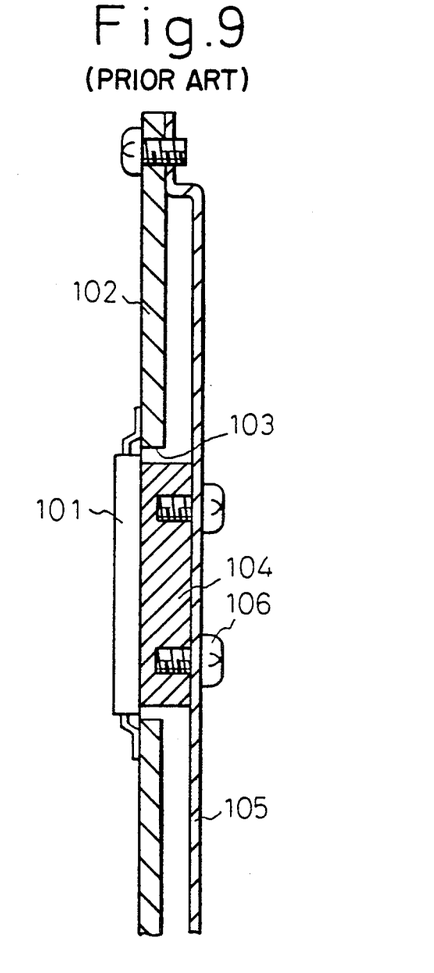
FIG. 9 is a side sectional view showing a conventional heat-radiation structure of the prior art.

To suppress the increase of the installation height of the semiconductor device, a structure is proposed in which, as shown in FIG. 9, an opening 103 is formed in the printed circuit board 102, through which a heat-conductive member 104 adhered to a backside of the semiconductor device 101 protrudes from the back surface of the printed circuit board 102, and a heat-radiation plate 105 is fixed on a protruding end surface of the heat-conductive member 104 by screws 106. According to this structure, a heat-radiation fin can be eliminated whereby the height of the semiconductor device is substantially decreased. Moreover, both surfaces of the printed circuit board 102 can be utilized as an area for mounting electronics parts.

This structure, however, has a drawback in that the screw 106 is utilized for fastening the heat-radiation plate 105 to the heat-conductive member 104, which causes the assembly/disassembly thereof troublesome and reduces the mounting space in the height direction to an extent corresponding to the protrusion of the screw head. Furthermore, if a relative position of the heat-conductive member 104 and the semiconductor device 101, which are adhered to each other, has not been correctly controlled, a threaded hole on the heat-conductive member 104 and that on the heat-radiation plate 105 may not be aligned with each other, and this results in a failure of the screwing operation or in an excessive stress on leads of the semiconductor device, which may cause a bad contact of the leads.

SUMMARY OF THE INVENTION

An object of the present invention is to solve the above problems of the prior art by further reducing a mounting height of a semiconductor device on a printed circuit board to thereby increase the accommodation density of printed circuit boards in a shelf so that a compactness of an electronics apparatus is enhanced as a whole.

Another object of the present invention is to provide a heat radiation structure for the electronics apparatus in which the mounting/dismounting operation of a heat-radiation fin, or plate, is easily carried out.

These objects of the present invention will be achieved by a heat-radiation structure for cooling a semiconductive device, such as an LSI, mounted on a surface of a printed circuit board so that an opening formed in a predetermined area of the printed circuit board exposes the bottom surface of the semiconductor device, which is brought into tight contact with a heat-conductive member so that an end surface of the heat-conductive member is exposed from the back surface of the printed circuit board through the opening and is brought into tight contact with a heat radiation plate disposed there, whereby the heat generated from the semiconductor or device is transmitted through the heat-conductive member to the heat-radiation plate and radiated into the ambient air from the surface thereof. At least one of the bottom surface of the semiconductor device and the heat-radiation plate is made of a magnetic substance, so that at least one of the semiconductor device and the heat-radiation plate is brought into tight (i.e., thermal contact with the heat-conductive member by the action of the permanent magnet intervened therebetween.

The permanent magnet may be integral with the conductor portion by an insertion thereof.

The conductor portion may have a shape complementary with a through-hole provided in a central area of the permanent magnet, and both may have mixing, a stepped and interlocking portions for preventing escape of one from the other.

The heat-radiation plate may comprise also a cover for a printed circuit board.

According to the present invention, screws are not used for fastening the semiconductor device, a heat-conductive member and a heat-radiation plate to each other, but instead, may be fastened by combination of bonding by an adhesive or magnetic attraction by a permanent magnet. This reduces the mounting height of the semiconductor device because the space required for the projecting screw head can be eliminated, whereby the mounting density of the electronics apparatus can be increased as a whole. Also, the removal of the heat-radiation plate can be conducted simply in a single, manual step, as contrasted to requiring a tool for the unscrewing step of the prior art structures.

BRIEF DESCRIPTION OF THE DRAWINGS

The above and other objects, advantages and features of the present invention will be described in more detail by the preferred embodiments shown in the following drawings, wherein.

DESCRIPTION OF THE PREFERRED EMBODIMENTS

Figure 1:
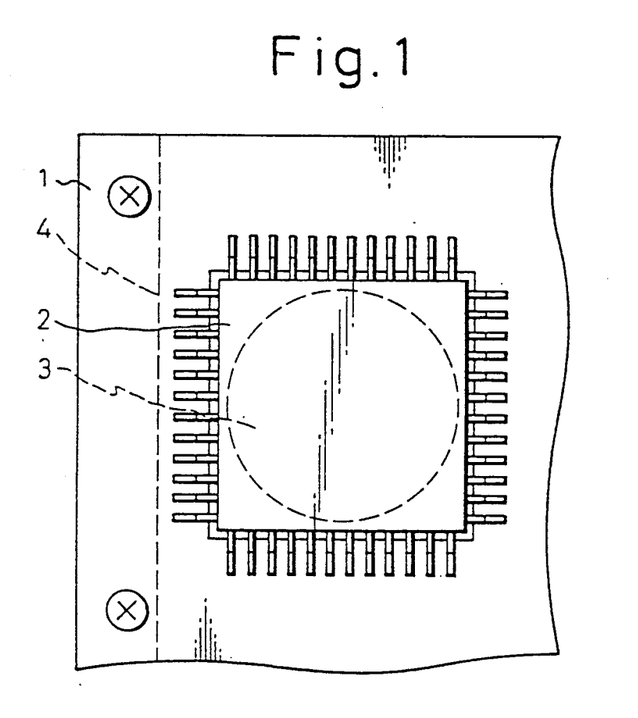
FIG. 1 is a plan view of a first embodiment according to the present invention.
Figure 2:
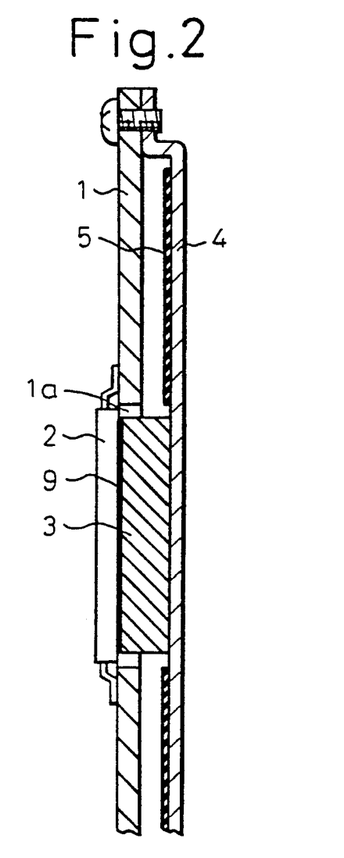
FIG. 2 is a side sectional view of the first embodiment.

In the embodiment illustrated in FIGS. 1 and 2, an opening 1a is provided in a predetermined area of a parts-mounting surface (i.e., a first main surface) of a printed circuit board 1, and a semiconductor device (LSI) is surface-mounted on the printed circuit board in such a manner that a backside main surface thereof confronts (i.e., is disposed within) the opening. On the bottom of the semiconductor device 2 is fixed a first main surface of a disc-like permanent magnet 3, by a heat-conductive adhesive 9, so that the opposite, second main surface of the permanent magnet is exposed and may protrude beyond, the backside, second main surface of the printed circuit board 1 through the opening 1a, and a cover made of a steel plate 4 is fixed on the permanent magnet 3 by the magnetic attraction force thereof. The cover 4 is originally used for electromagnetically shielding the printed circuit board, and accordingly, the cover 4 causes the printed circuit board 1 to float, and thus is coated with an insulating sheet 5 on the inner surface and fixed to the printed circuit board by screws at predetermined positions in a peripheral area thereof. A feature of the present invention resides in the utilization of this cover 4 as a heat-radiation plate.

Heat generated from the semiconductor device 2 is transmitted to the cover 4 via the permanent magnet 3 being brought into tight and thus thermal contact therewith, and is radiated into the ambient air since being distributed over the majority of the surface of the cover.

Figure 3:
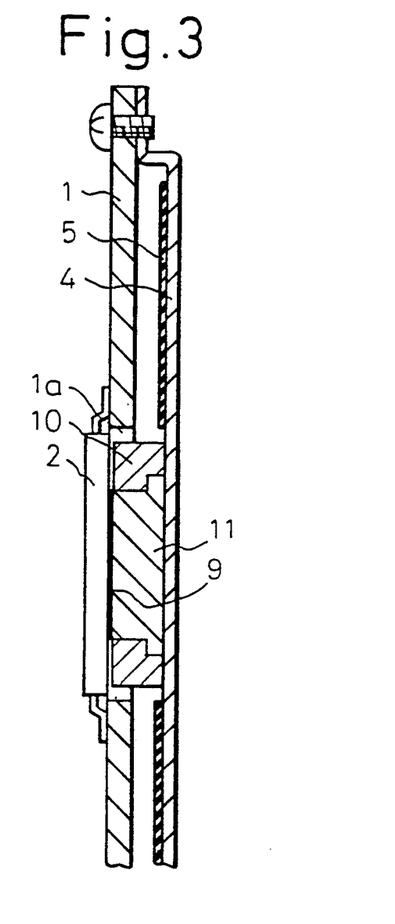
FIG. 3 is a side sectional view of a second embodiment according to the present invention.

FIG. 3 shows a second embodiment of the present invention, the difference of which when compared to the first embodiment, resides in the structure of a permanent magnet for connecting a semiconductor device 2 with a cover 4. That is, according to the second embodiment, an annular permanent magnet 10 having a central opening 10' and a heat-transmission body 11 fitted into the central opening 12 of the magnet 10 are used, by contrast to the first embodiment in which a permanent magnet itself is used as the heat-conductive member.

Figure 4:
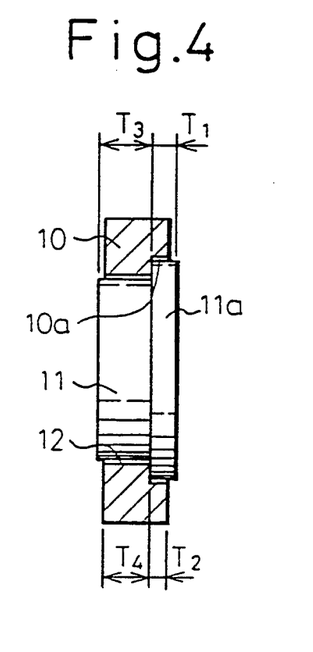
FIG. 4 is a side sectional view of a heat-conductive member of the second embodiment, showing a dimensional relationship thereof.

Specifically, as shown in FIG. 4, the permanent magnet 10 has a central opening through hole, 12 having a stepped portion 10a, and the heat-transmission body 11 is formed of material with a high heat-conductive coefficient, such as copper or aluminum. The heat-transmission body 11 is shaped as a flanged cylinder having dimensions and configurations complementary with those of the central through hole 12, so that it is positioned in the through hole 12 while a flange 11a thereof rests on the stepped portion 10a. The opposite end surfaces 11-1 and 11-2 of the heat-transmission body 11 slightly protrude from the respective, opposite end surfaces, 10-1 and 10-2 of the permanent magnet 10. Namely, the dimensional relationship is defined by the following equations:

$$T_1 \geqq T_2$$

$$T_3 \geqq T_4$$

The end surface 11' of the heat-transmission body 11 is fixedly secured to the bottom surface of the semiconductor device 2; the permanent magnet 10 is not fixed to the latter, but rather the permanent magnet 10 is held, so that it will not be detached from the through-hole 12 in a floating manner by the step portion 10a being the mating 11a. Accordingly, only the heat-transmission body 11 can be brought into tight contact with the cover 4.

Figure 5:
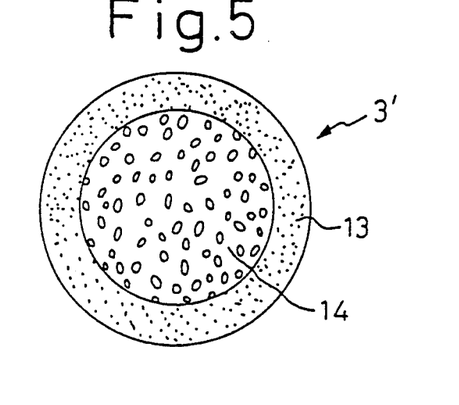
FIG. 5 is a plan view of a third embodiment according to the present invention.

FIG. 5 shows a third embodiment of the present invention, which is a modification of the first embodiment. In this third embodiment, a heat-conductive member 3' is used as a member corresponding to the heat-conductive permanent magnet 3 in FIG. 2. The member 3' has a disc shape in which a material 14 with a high heat-conductive coefficient, such as copper or aluminum, is inserted into a central area thereof and is integral with a magnet-forming substance 13 constituting the remaining peripheral portion. As shown in the drawing, since this member 3' consists of a material 14 having a high heat-conductive coefficient in the central portion thereof, and a magnet-forming substance 13 in the remaining peripheral portion thereof, it can effectively collect the heat from the central area of the semiconductor device 2. When a magnetic rubber is used as the magnet-forming substance 13, cracking of the magnet forming substrate to the difference in thermal expansion coefficients between the magnet-forming substance 13 and the high heat-conductive material 14 such as aluminum is avoided.

Figure 6:
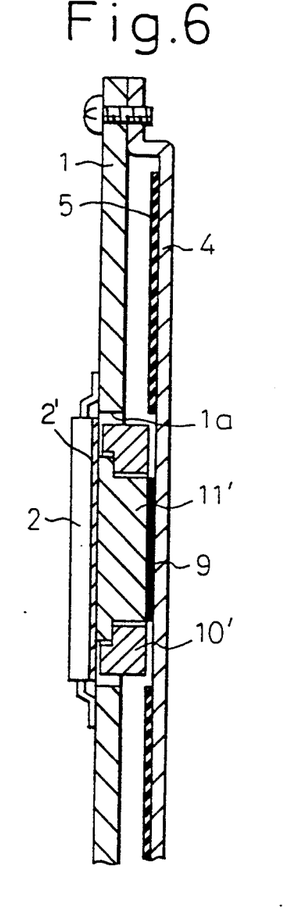
FIG. 6 is a side sectional view of a fourth embodiment according to the present invention.

In the first embodiment, the cover 4 is made of a magnetic substance (i.e., a ferromagnetic material which is attracted by a magnetic field) and attracted toward the semiconductor device by the action of the permanent magnet fixedly adhered to the bottom surface of the semiconductor device. When the bottom surface of the semiconductor device is made of a magnetic substance comprising a ferromagnetic layer 2' as shown in FIG. 6, however, the permanent magnet 3 may be fixedly adhered to the cover 4, so that the former can attract the semiconductor device 2 by virtue of the ferromagnetic layer 2' (a fourth embodiment). According to the fourth embodiment, the cover can be made of a non-magnetic substance having a good heat-conductivity, whereby the heat radiation is further enhanced.

Figure 7:
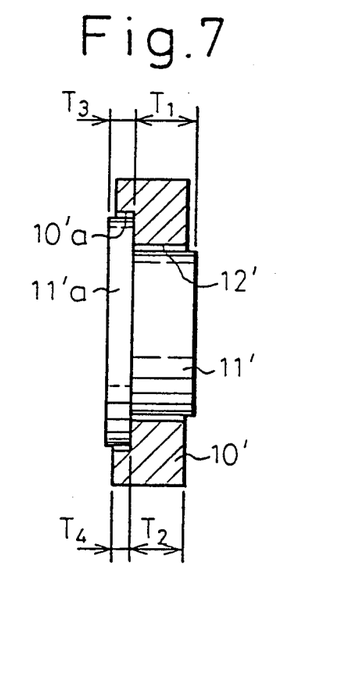
FIG. 7 is a side sectional view of a heat-conductive member of the fourth embodiment, showing dimensional relationships thereof.

FIG. 6 and 7 illustrate the fourth embodiment applied to a semiconductor device with the bottom made of a magnetic substance, which figures correspond to FIGS. 3 and 4, respectively, showing the second embodiment. An annular permanent magnet 10' has a central through-hole 12' having a stepped portion 10'a, in which hole is fitted a cylindrical heat-transmission body 11'. One end surface of the heat-transmission body 11' fixedly adhered onto the bottom surface of the cover 4 with a heat-conductive adhesive 9, and the other end surface thereof confronts the bottom surface of the semiconductor while being in contact therewith.

The permanent magnet 10' is held between the cover 4 and the semiconductor device in a floating manner, with the stepped portion 10'a thereon engaged with a flange 11'a of the heat-transmission body 11' so that the permanent magnet 10' retained within the through-hole. Both end surfaces of the heat-transmission body 11' are slightly protruded from the respective end surfaces of the permanent magnet 10', i.e., the dimensional relationship is defined by the equations $T_1 \geqq T_2$ and $T_3 \geqq T_4$ as shown in FIG. 7, so that only the contiguous end surface of the heat-transmission body 11' is pressed onto and in tight contact with the bottom surface of the semiconductor device 2 when the permanent magnet 10' attracts the bottom of the semiconductor device 2.

In the preceding embodiments, the heat-transmission body or permanent magnet is in a circular form, but another shape such as quadrant, etc., may be selected. Also in the second and fourth embodiments, the permanent magnet is inserted into the heat-transmission body and held in a floating manner, but both members may be adapted so that the respective opposite end surfaces thereof are flush with each other and fixedly adhered to the cover and to the bottom surface of the semiconductor device respectively. This increases the heat-conductive cross-section and the heat-radiation effect. In addition, the provision of the stepped portion in the through-hole for inhibiting the escape of the permanent becomes unnecessary, because the latter is fixed.

In the preceding embodiments, a block-shaped member is used as a heat-transmission body, but one obtained by sheet metal processing may be economically used.

Preferably, the permanent magnet used in the preceding embodiments is magnetized such that a plurality of pairs of N and S poles are arranged in a peripheral direction of the magnet body only on the surface confronting the cover 4, because a very strong attractive force is derived only on this surface, while the other surface confronting the semiconductor device is not so affected by the magnetism.

As stated above, the mounting/dismounting of a heat-conductive plate becomes easier because, instead of using screws for fixing the heat-conductive plate to the semiconductor device, the bottom surface of the semiconductor device and the heat-radiation plate are magnetically attracted so that the heat-conductive member is brought into tight and therefor thermal contact with both of them.

The mounting height of the semiconductor device can be substantially reduced due to the elimination of the protrusion of the screw head, whereby the accommodation efficiency of printed circuit boards in a shelf is improved and the compactness of the electronics apparatus is enhanced.

Also, a robot for mounting a semiconductor device on a printed circuit board can be effectively used because there is no heat-radiation fin on the semiconductor device.

We claim:

1. A heat radiation structure in combination with a printed circuit board having upper and lower, spaced and substantially parallel main surfaces, comprising:
   a heat radiation plate having a main surface disposed parallel to and spaced from the lower main surface of the printed circuit board;
   a heat generating element mounted on, and having a lower main surface substantially parallel to, the upper main surface of the printed circuit board, the printed circuit board having an opening through which corresponding surface portions of the main surface of the heat radiation plate and the lower main surface of the heat generating element, respectively, are mutually exposed, the corresponding surface portions accordingly being disposed in spaced and substantially parallel relationship; and
   means, disposed within and extending through the opening of the printed circuit board and having opposite end surfaces respectively affixed to the corresponding surface portions of the main surface of the heat radiation plate and the heat generating element, for interconnecting the heat generating element and the heat radiation plate structurally and in heat conducting relationship, one of the corresponding surface portions being of a ferromagnetic material and the interconnecting means generating a permanent magnetic field for affixing the one surface portion of ferromagnetic material to the respective opposite end surface of the interconnecting means by magnetic attraction.

2. A heat radiation structure as recited in claim 1, wherein the interconnecting means further comprises:
   a layer of adhesive material affixing the other of the opposite end surfaces of the interconnecting means to the other one of the corresponding surface portions.

3. A heat radiation structure as recited in claim 1, wherein the interconnecting means comprises:
   a permanent magnet having a first end comprising one of the opposite end surfaces of the interconnecting means and a second end, the permanent magnetic field of the permanent magnet affixing the one of the corresponding surface portions of ferromagnetic material to the first end of the permanent magnet by magnetic attraction.

4. A heat radiation structure as recited in claim 3, further comprising:
   a layer of heat conducting adhesive on the second end of the permanent magnet and defining therewith the second end surface of the interconnecting means, the layer of heat conductive adhesive affixing the other of the corresponding surface portions thereto.

5. A heat radiation structure as recited in claim 4, wherein:
   the one of the corresponding surface portions of ferromagnetic material comprises the corresponding surface portion of the main surface of the heat radiation plate exposed through the opening in the printed circuit board.

6. A heat radiation structure as recited in claim 4, wherein:
   the one of the corresponding surface portions of the ferromagnetic material comprises the surface portion of the lower main surface of the heat generating element which is exposed through the opening in the printed circuit board.

7. A heat radiation structure as recited in claim 1, wherein the interconnecting means further comprises:
   a first component of a magnetic field generating material having a first heat conductance value;
   a second component of a material having a second heat conductance value greater than the first heat conductance value; and
   each of the first and second components extending between said defining respectively corresponding first and second component portions of each of the opposite end surfaces of the interconnecting means.

8. A heat radiation structure as recited in claim 1, wherein:
  the second component is of generally cylindrical configuration, defining a longitudinal axis therethrough and having a first diameter; and
  the first component is of generally annular configuration, coaxial with the longitudinal axis, and has an inner cylindrical surface contiguous with the outer cylindrical surface of the second component.

9. A heat radiation structure as recited in claim 1, wherein the interconnecting means further comprises:
  a first component of generally cylindrical configuration defining a longitudinal axis and including a first axial portion defining one of the opposite end surfaces of the interconnecting means and an integral, second axial portion of a second, different diameter and defining the other of the opposite end surfaces of the interconnecting means, the first component being formed of a heat conductance material, the axial portion having the larger diameter also having a shorter axial length and thereby having the configuration of an annular flange; and
  a second component of a generally annular configuration and having a stepped, interior cylindrical surface defined by third and fourth, different diameters selected relatively to the first and second diameters, so as to annularly surround and axially engage the annular flange axial portion of the first component, the second component being of a magnetic field generating material.

10. A heat radiation structure as recited in claim 9, wherein:
  the one of the corresponding surface portions of ferromagnetic material comprises the corresponding surface portion of the main surface of the heat radiation plate exposed through the opening in the printed circuit board and is affixed by magnetic attraction, produced by the permanent magnetic field generated by the second component, to the opposite end surface of the interconnecting means defined by the annular flange axial portion thereof.

11. A heat radiation structure as recited in claim 10, further comprising:
  a layer of heat conducting adhesive on the other end of the interconnecting means, defined by the other axial portion thereof and affixing thereto the lower main surface of the heat generating element.

12. A heat radiation structure as recited in claim 9, wherein:
  the one of the corresponding surface portions of ferromagnetic material comprises the lower main surface of the heat generating element and is affixed by magnetic attraction, produced by the permanent magnetic field generated by the second component, to the opposite end surface of the interconnecting means defined by the annular flange axial portion thereof.

13. A heat radiation structure as recited in claim 12 further comprising:
  a layer of heat conducting adhesive on the other end of the interconnecting means, defined by the other axial portion thereof and affixing thereto the corresponding surface portion of the main surface of the heat radiation plate exposed through the opening in the printed circuit board.

* * * * *

UNITED STATES PATENT AND TRADEMARK OFFICE
CERTIFICATE OF CORRECTION

PATENT NO. : 5,262,922

DATED : November 16, 1993

INVENTOR(S) : Hiroshi YAMAJI et al.

It is certified that error appears in the above-identified patent and that said Letters Patent is hereby corrected as shown below:

<u>Col. 2</u>, line 12, change "semiconductive" to --semiconductor--;

line 23, delete "or";

line 30, after "thermal" insert --)--;

line 32, insert the following paragraph:

--The magnetic heat-conductive member may have a magnetic portion and a conductor portion.--;

line 37, change "mixing" to --mating--, and delete "a"; and     line 46, after "by" insert --a--.

<u>Col. 3</u>, line 12, change "product" to --prior art--;

line 28, after "exposed" insert --at,--;

line 49, after "which" insert --,--; and line 60, after "opening" insert --,or--.

<u>Col. 4</u>, line 16, after "being" insert --engaged with--;

line 18, after "mating" insert --flange--;

line 29, after "remaining" insert --,--;

lines 36 and 37, change "magnet forming" to --magnet-forming--; and     line 37, delete "substrate" and insert --substance--, and before "to" insert --due--.

UNITED STATES PATENT AND TRADEMARK OFFICE
CERTIFICATE OF CORRECTION

PATENT NO. : 5,262,922

DATED : November 16, 1993

INVENTOR(S) : Hiroshi YAMAJI et al.

It is certified that error appears in the above-identified patent and that said Letters Patent is hereby corrected as shown below:

<u>Col. 5</u>, line 5, after "10'" insert --is--;

line 24, after "device" insert --,--;

line 25, after "and" insert --improves--;

line 27, after "permanent" insert --magnet--; and line 46, after "tight" insert --,--.

Signed and Sealed this

Sixth Day of September, 1994

Attest:

BRUCE LEHMAN

*Attesting Officer*   Commissioner of Patents and Trademarks